(12) United States Patent
Tanisaka

(10) Patent No.: US 8,053,262 B2
(45) Date of Patent: Nov. 8, 2011

(54) METHOD FOR MANUFACTURING NITRIDE SEMICONDUCTOR LASER ELEMENT

(75) Inventor: Shingo Tanisaka, Anan (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 12/431,393

(22) Filed: Apr. 28, 2009

(65) Prior Publication Data

US 2009/0275159 A1 Nov. 5, 2009

(30) Foreign Application Priority Data

May 2, 2008 (JP) ................................ 2008-120446
Sep. 16, 2008 (JP) ................................ 2008-236026

(51) Int. Cl.
*H01L 21/00* (2006.01)
(52) U.S. Cl. ............... 438/42; 438/39; 438/40; 438/43; 257/627; 257/623; 257/E33.003
(58) Field of Classification Search ........... 438/40, 438/39, 42, 43; 257/E33.003, E21.599, 627, 257/623
See application file for complete search history.

(56) References Cited

U.S. PATENT DOCUMENTS

| | | | | |
|---|---|---|---|---|
| 3,833,435 | A | * | 9/1974 | Logan et al. ............ 438/31 |
| 4,797,374 | A | * | 1/1989 | Scott et al. ............. 438/40 |
| 4,904,617 | A | | 2/1990 | Muschke |
| 7,149,233 | B2 | | 12/2006 | Furukawa et al. |
| 2002/0022285 | A1 | * | 2/2002 | Narui ..................... 438/39 |
| 2002/0125492 | A1 | * | 9/2002 | Shakuda .................. 257/94 |
| 2006/0209395 | A1 | * | 9/2006 | Sasaoka ................. 359/344 |
| 2008/0056324 | A1 | * | 3/2008 | Lee ...................... 372/50.121 |
| 2010/0047947 | A1 | * | 2/2010 | Yashima et al. ......... 438/40 |

FOREIGN PATENT DOCUMENTS

| | | | |
|---|---|---|---|
| JP | 62283686 A | * | 12/1987 |
| JP | 62286294 A | * | 12/1987 |
| JP | H01-120885 A | | 5/1989 |
| JP | H09-223844 A | | 8/1997 |
| JP | 2000-106470 A | | 4/2000 |
| JP | 2000-114666 A | | 4/2000 |
| JP | 2006-24703 A | | 1/2006 |
| WO | WO02/103865 A1 | | 12/2002 |
| WO | WO02/103866 A1 | | 12/2002 |

* cited by examiner

*Primary Examiner* — Jarrett Stark
(74) *Attorney, Agent, or Firm* — Global IP Counselors, LLP

(57) ABSTRACT

A method for manufacturing a nitride semiconductor laser element having a nitride semiconductor layer including at least an active layer provided on a substrate, a pair of cavity planes formed on the nitride semiconductor layer, and a protruding part where part of the substrate protrudes from said cavity plane, said method comprises: a step of forming the nitride semiconductor layer on the substrate; a first etching step of forming a first groove by etching at least the nitride semiconductor layer; and a second etching step of forming the cavity plane, in the second etching step, the inner wall of the first groove and part of the nitride semiconductor layer surface adjacent to the first groove are etched to form a second groove, and form the upper face of the protruding part.

14 Claims, 10 Drawing Sheets

(a)  (b)

(a)  (b)

METHOD FOR MANUFACTURING NITRIDE SEMICONDUCTOR LASER ELEMENT

CROSS-REFERENCE TO RELATED APPLICATION

This application claims priority to Japanese Patent Application Nos. 2008-120446 and 2008-236026. The entire disclosure of Japanese Patent Application Nos. 2008-120446 and 2008-236026 is hereby incorporated herein by reference.

BACKGROUND OF THE INVENTION

1. Field of the Invention

The present invention relates to a method for manufacturing a nitride semiconductor laser element, and more particularly relates to a method for manufacturing a cavity plane for a nitride semiconductor laser element.

2. Background Information

Cleavage, etching, and various other methods have been employed in the past to form a cavity plane for a nitride semiconductor laser element. Of these, forming a cavity plane by dry etching allows just the cavity plane part of the nitride semiconductor layer to be formed by etching, without etching all the way down to the lower part of the nitride semiconductor layer that makes up the laser element and the substrate on which this nitride semiconductor layer is laminated. Therefore, a plane protective film can be formed in wafer units, so the process is simplified, the advantage to which is lower cost, compared to a method in which the substrate and the nitride semiconductor layer formed on the substrate are split in the shape of a bar and a protective film for the cavity plane is formed in bar units to form a cavity plane by cleavage (see Japanese Laid-Open Patent Application H9-223844 and WO2002/103865).

However, when a cavity plane is formed by etching after a nitride semiconductor layer has been laminated on a substrate, a terrace-like horizontal face may be formed between the cavity plane and the element separation face after the element has been separated. This terrace-like horizontal face can block the light of the laser beam from the emitting plane part of the cavity plane, or reflect this light, etc., resulting in disturbance of the far field pattern.

Method that have been proposed to prevent this disturbance of the field image, and with which the formation of a terrace-like horizontal face is minimized, include a method in which a cavity plane is first formed, and then a V-shaped auxiliary groove is formed for substrate division (such as Japanese Laid-Open Patent Application H1-120885), a method in which a semiconductor layer is laminated on a substrate, an electrode is produced over an active layer, and then an element separation groove is formed, after which a cavity plane is produced by etching, and a method in which this element division groove is formed so that the angle formed between the groove face and the substrate face is an acute angle at an light emission-side plane (such as Japanese Laid-Open Patent Application 2000-106470).

However, with a method in which a V-shaped auxiliary groove is formed after the formation of the cavity plane, because the V-shaped auxiliary groove is V-shaped, the cavity plane has to be protected with a resist or other such protective film during this V groove formation. However, if the cavity plane is protected by covering it with a resist or the like, the thickness of this protective film will result that a distance will be opened up between the cavity plane and the auxiliary groove after etching due to the protective film becoming a mask, and this ends up being a problem in that a terrace-like horizontal face is formed between the cavity plane and the element separation face.

Even when the cavity plane is etched after the element separation groove has been formed, alignment of the cavity plane mask is necessary, and a terrace-like horizontal face is formed at the margin thereof.

Furthermore, when an element separation groove is formed by dicing or the like, a problem is that the nitride semiconductor layer is susceptible to damage.

When this element separation groove is formed such that the angle formed between the groove face and the substrate face is an acute angle, not only is it difficult to dice diagonally with good precision, but also it is difficult to form the grooves equidistantly spaced, so this approach is believed to be inefficient. Furthermore, with a completed element, since the substrate is removed from under the emission-side cavity plane, which is where heat is most likely to build up, another problem is that heat dissipation is worse.

SUMMARY OF THE INVENTION

It is an object of the present invention to provide a method for manufacturing a nitride semiconductor laser element with which a terrace-like horizontal face is eliminated between the cavity plane and the element separation face, and a good far field pattern can be obtained, by a simple method.

A method for manufacturing a nitride semiconductor laser element of the present invention (hereafter referred to "a laser element") is a method for manufacturing a laser element having a nitride semiconductor layer including at least an active layer provided on a substrate, a pair of cavity planes formed on the nitride semiconductor layer, and a protruding part where part of the substrate protrudes from said cavity plane, said method comprising: a step of forming the nitride semiconductor layer on the substrate; a first etching step of forming a first groove by etching at least the nitride semiconductor layer; and a second etching step of forming the cavity plane, in the second etching step, the inner wall of the first groove and part of the nitride semiconductor layer surface adjacent to the first groove are etched to form a second groove, and form the upper face of the protruding part.

DETAILED DESCRIPTION OF THE PREFERRED EMBODIMENTS

Figure 1:
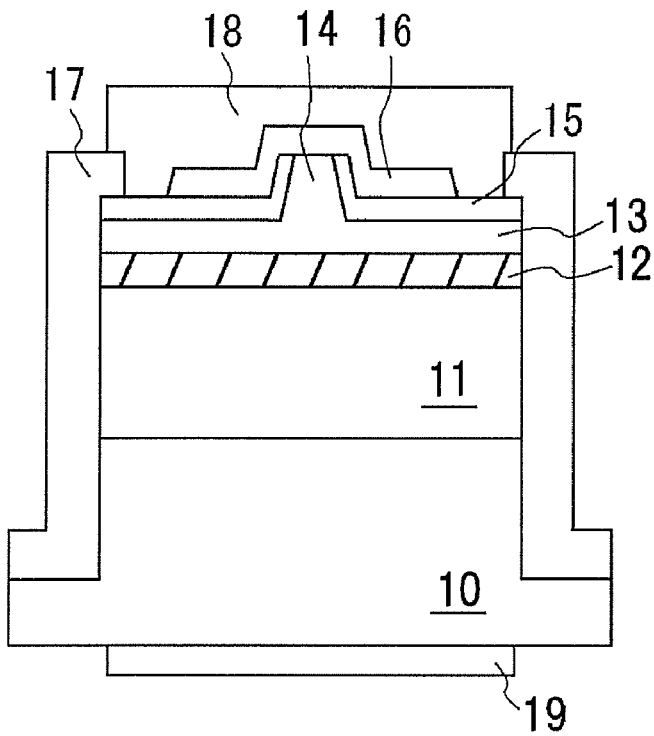
FIG. 1 is a schematic cross-sectional view describing a structure of a laser element of the present invention.
Figure 2:
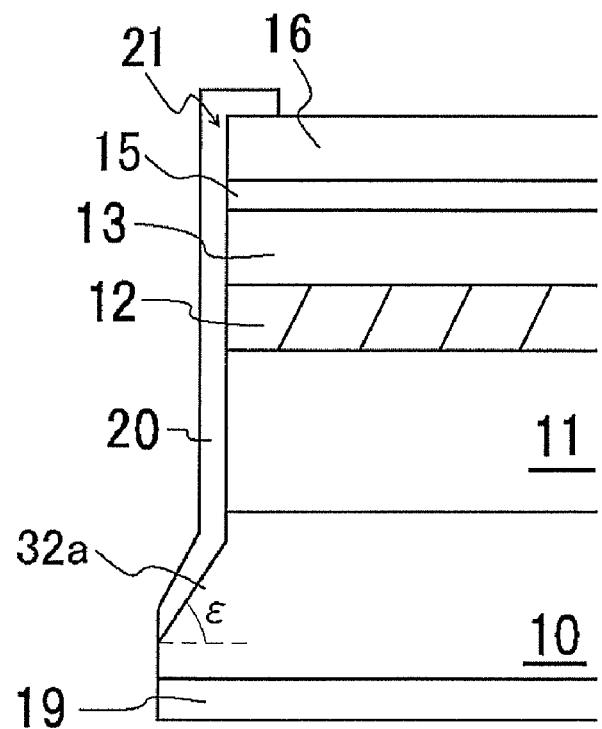
FIG. 2 is a schematic longitudinal section view describing a structure of a laser element of the present invention.

With the method for manufacturing a nitride semiconductor laser element of the present invention, for example, as shown in typical form in FIGS. 1 and 2, a nitride semiconductor laser element is manufactured so as to have a protruding part 32a on part of the substrate by forming a cavity comprising a pair of opposing cavity planes 21 in a nitride semiconductor layer in which it mainly has a nitride semiconductor substrate, and the nitride semiconductor layer laminated over this and composed of a first nitride semiconductor layer 11, an active layer 12, and a second nitride semiconductor layer 13.

Such laser element usually comprises a ridge 14 on the surface of the second nitride semiconductor layer 13, and a plane protective film 20 in contact with all of the cavity planes 21. Also, a third protective film 15 is formed on the ridge side face and a side face protective film 17 is formed on the side face of the nitride semiconductor layer, and a p electrode 16, a p pad electrode and an n electrode 19 and so forth are formed.

Figure 3:
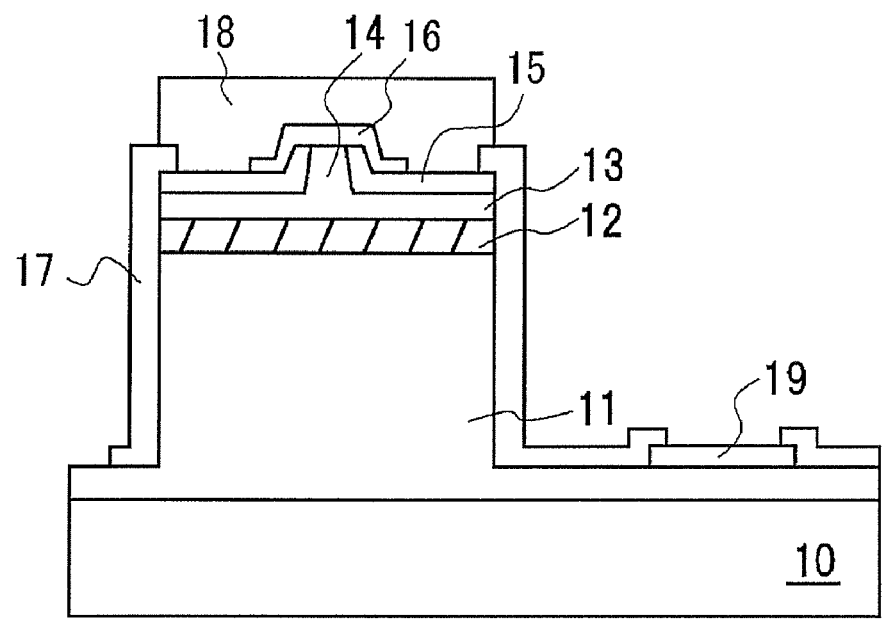
FIG. 3 is a schematic cross-sectional view describing a structure of another laser element of the present invention.

The laser element manufactured with the manufacturing method of the present invention may be as shown in FIG. 3, for example, in which the n electrode 19 is disposed on the same side relative to the nitride semiconductor substrate 10.

With the method for manufacturing the laser element of the present invention, first the first nitride semiconductor layer, the active layer, and the second nitride semiconductor layer are laminated in that order over the nitride semiconductor substrate to form the nitride semiconductor layer.

The substrate used in the present invention may be an insulating substrates, such as sapphire, spinel (MgAl$_2$O$_4$); SiC; silicon, ZnS, ZnO, GaAs, diamond; and an oxide substrate, such as lithium niobate, neodymium gallide which are lattice-matched to nitride semiconductor. Of these, a nitride semiconductor substrate, such as GaN, AlN and so force are preferable. Furthermore, the substrate preferably has an off angle of no more than 10° and greater than 0° to the first main face and/or the second main face. The thickness of the substrate is at least 50 μm and no more than 10 mm, for example. A commercially available substrate, any of the various known substrates disclosed, for instance, in Japanese Laid-Open Patent Application 2006-24703, or the like may be used.

The nitride semiconductor substrate can be formed by a vapor phase growth method such as MOCVD (Metal Organic Chemical Vapor Deposition), HVPE (Hydride Vapor Phase Epitaxy), MBE (Molecular Beam Epitaxy) or the like, a hydrothermal synthesis method in which crystals are grown in a supercritical fluid, a high pressure method, a flux method, a melt method, or the like.

The nitride semiconductor layer making up the first and second nitride semiconductor layer may include a layer having a general formula of In$_x$Al$_y$Ga$_{1-x-y}$N (0≦x≦1, 0≦y≦1, 0≦x+y≦1). In addition to this, it may be used the semiconductor layer which is partly substituted with B as a group III element, or is substituted a part of N as a group V element with P or As. An n-side semiconductor layer may doped with at least one n-type impurity of IV or VI group elements, such as Si, Ge, Sn, S, O, Ti, Zr, Cd, etc. A p-side semiconductor layer may doped with at least one p-type impurity, such as Mg, Zn, Be, Mn, Ca, Sr, etc. The doped concentration is, for example, about 5×10$^{16}$/cm$^3$ to about 1×10$^{21}$/cm$^3$.

The first and second nitride semiconductor layer preferably have a SCH (Separate Confinement Heterostructure) wherein an optical waveguide is constituted by providing n-side and p-side optical guide layers above and below the active layer.

The active layer may be a multiple quantum well or single quantum well structure.

A well layer and a barrier layer may be used a layer having a general formula of In$_x$Al$_y$Ga$_{1-x-y}$N (0≦x≦1, 0≦y≦1, 0≦x+y≦1). At least the well layer may be comprises a layer which includes indium, and it is preferable that the well layer and the barrier layer both include indium.

Such active layer is preferably formed a composition with an emission wavelength of about 220 to 580 nm.

There is no particular restriction on a growth method of the nitride semiconductor layer, it can be formed by means of any known method which can grow these nitride semiconductor layers, such as MOCVD (Metal Organic Chemical Vapor Deposition), HVPE (Hydride Vapor Phase Epitaxy), MBE (Molecular Beam Epitaxy) or the like. In particular, MOCVD is preferable because it allows the nitride semiconductor to be growth with good crystallinity.

The ridge (see FIG. 1, 14) is usually formed on the surface of the nitride semiconductor layer, i.e., the second nitride semiconductor layer. The ridge functions as an optical waveguide, the width of the ridge may be from about 1.0 to 30.0 μm. It is preferably about 1.0 to 3.0 μm when a laser light is used for a light source of a single horizontal mode. The height of the ridge (the etching depth) may be, for example, from about 0.1 to 2 μm. The extent of optical confinement can be suitably adjusted by adjusting the thickness, material, and so on of the layer that making up the p-side semiconductor layer. The ridge is preferably set so as to be about 100 to 5000 μm of cavity length. The ridge need not be all the same width in the extension direction of the cavity, and its side faces may be vertical or may be tapered with an angle of about 45 to 90°.

The ridge does not necessarily have to be formed, and the structure may be one in which a current constricting layer is formed on the nitride semiconductor layer, for example. In this case, first the first nitride semiconductor layer is formed, and a current constricting layer is formed with a film thickness of about 0.01 to 5 μm, and preferably about 300 nm or less, and having a stripe-shaped opening with a width of about 0.3 to 20 μm, and preferably about 0.5 to 3.0 μm. Next, an active layer having a quantum well structure, for example, is formed over a first conduction type semiconductor layer exposed in the opening of the current constricting layer. A second conduction type semiconductor layer is then formed over the active layer. This current constricting layer can be formed, for example, from an i-type nitride semiconductor layer or from $SiO_2$, $Al_2O_3$, or another such insulating material. The current constricting layer may be produced by forming a first nitride semiconductor layer or a second nitride semiconductor layer, growing a current constricting layer on the surface of this, forming a stripe-shaped opening in this current constricting layer, and regrowing a nitride semiconductor layer.

With the nitride semiconductor layer, for example, a cavity is formed in the direction in which the above-mentioned ridge extends, and a pair of cavity planes is formed perpendicular to this direction. The cavity length is preferably set to about 100 to 5000 μm. There are no particular restrictions on the planar orientation of the cavity planes, but examples include M axis, A axis, C axis, and R axis orientation. That is, a plane selected from the group consisting of the M plane (1-100), the A plane (11-20), the C plane (0001), and the R plane (1-102), with M axis orientation and the M plane (1-100) being particularly favorable.

The width of the laser element of the present invention, that is, its length in the direction perpendicular to the cavity direction, is set to about 50 to 2000 μm.

Next, a first groove having a face that is inclined with respect to the cavity plane that is subsequently formed by etching from the nitride semiconductor layer side, that is, a face that is inclined from the normal direction with respect to the nitride semiconductor layer surface and/or the substrate surface. This groove is preferably narrower at its bottom part than at its top part. This groove is used to help in splitting in the splitting of the element (discussed below), that is, in the formation of individual laser elements from the wafer, and is preferably formed so as to extend perpendicular to the direction of extension of the above-mentioned current constricting layer or ridge.

There are no particular restrictions on the cross sectional shape of this groove, but examples include semicircular, semi-elliptical, square, V-shaped, and various other shapes. Of these, the groove is preferably formed in a longitudinal semi-elliptical, trapezoidal, V, or other such shape. A V shape is particularly preferable because it is easier for the groove width to be widened by etching as discussed below. There are no particular restrictions on the angle of the V here (α in FIG. 4a), but an example is about 40 to 85°, and preferably about 50 to 75° from the horizontal face of the substrate.

There are no particular restrictions on the depth of the groove (h in FIG. 4a), but an example is the depth is down to at least part of the nitride semiconductor layer, and preferably part of the first nitride semiconductor layer, or to put it another way, about 1.5 to 2.8 μm, and preferably about 1.8 to 2.5 μm from the nitride semiconductor layer surface. There are no particular restrictions on the width of the groove (w in FIG. 4a), but an example is about 1 to 5 μm, and preferably about 1 to 3 μm at the nitride semiconductor layer surface. The spacing of the grooves can be suitably adjusted according to the size of the laser element to be obtained, the length of the cavity, and so forth, but an example is about 100 to 5000 μm.

Also, the groove does not necessarily have to be formed all the way in the direction of the chip width, and may only be formed part of the way in the element width direction so as to correspond to at least an optical waveguide path. In other words, a groove may be formed in the semiconductor layer and/or substrate in the region directly below the optical path of the emitted laser beam.

The groove can be formed by forming on the nitride semiconductor layer surface a mask pattern having a stripe-shaped opening of a specific width, and etching while using this mask pattern as a mask. The mask pattern can be produced in a suitable shape by patterning a resist, $SiO_2$ or another such insulator, or the like by a known method such as photolithography or etching. This etching may be either wet or dry etching.

Wet etching can be performed, for example, by exposing the nitride semiconductor layer to an etchant, such as immersing the layer for a specific length of time in an alkali aqueous solution, aqua regia, or another such etchant.

Dry etching can be performed, for example, by using reactive ion etching (RIE), reactive ion beam etching (RIBE), electron cyclotron resonance (ECR) etching, ion beam etching and the like. In any case, an etching gas may be suitably selected (such as $CF_4$ or another fluorine-based gas, or $Cl_2$, $CCl_4$, $SiCl_4$ or another chlorine-based gas, either alone or as a mixed gas). The use of dry etching is particularly preferable. In dry etching, the etching conditions including the type of etchant (the flow of etchant, the RF power, the pressure, the temperature, the etching duration, etc.) can be adjusted as desired.

The side walls of the groove here can be slanted by using a method such as raising the RF power, lowering the pressure (creating a high vacuum), or raising the $SiCl_4$ ratio when etching with a chlorine-based gas. In particular, when etching with a chlorine-based gas, if the $SiCl_4$ ratio is raised, it tends to be easier to form a groove having a V-shaped cross section. A groove that is semi-elliptical or trapezoidal tends to be formed when the flow of etchant is reduced.

By thus forming the groove by etching, as opposed to by dicing, blasting, or the like, physical damage to the substrate or the nitride semiconductor layer can be avoided, and the groove can be formed in the desired shape and exactly where desired.

The cavity planes are then formed by etching.

Usually, the cavity plane of the laser element can be formed by forming a mask pattern over the nitride semiconductor layer, using this mask pattern as a mask, and etching down to a depth that reaches at least the second nitride semiconductor layer, the active layer, the first nitride semiconductor layer, or the substrate (D in FIG. 4b), or to a depth at which the optical waveguide region and a boundary region (discussed below) can be included in the cavity plane.

Here, the cavity plane is preferably formed parallel to the previously formed groove and near this groove, such as a distance of about 5 μm or less, and preferably 3 μm or less, and more preferably 2 μm or less (d in FIG. 4a), away from the groove. The mask pattern and how it is formed are the same as those listed as examples above, further a known method is discussed, for example, in Japanese Laid-Open Patent Application H8-17803. The use of dry etching is particularly good, and the etching conditions can be adjusted as desired just as discussed above.

The cavity plane is generally formed substantially perpendicular to the substrate surface. This is intended to prevent the decrease in the COD level and/or the rise in the threshold current that would occur if the cavity plane were tapered or inversely tapered with respect to the substrate surface. Also, if the cavity plane is tapered or inversely tapered with respect to the substrate surface, the optical axis will be offset in the Y direction, so it is preferable for the cavity plane to be substantially perpendicular to the substrate surface in order to prevent this as well.

Figure 8:
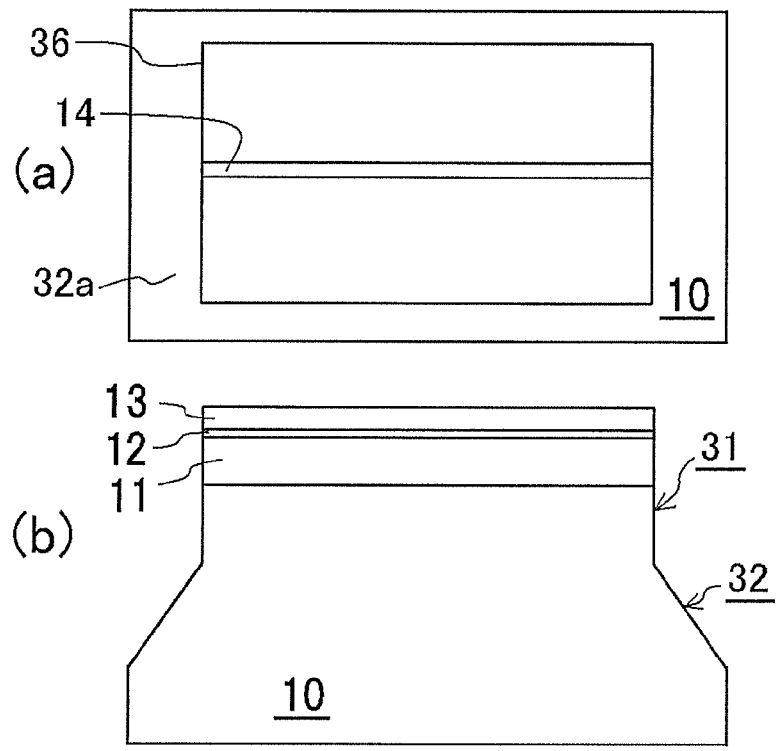
FIG. 8 is a schematic plane view and a schematic cross-sectional view describing a structure of another laser element of the present invention.
Figure 9:
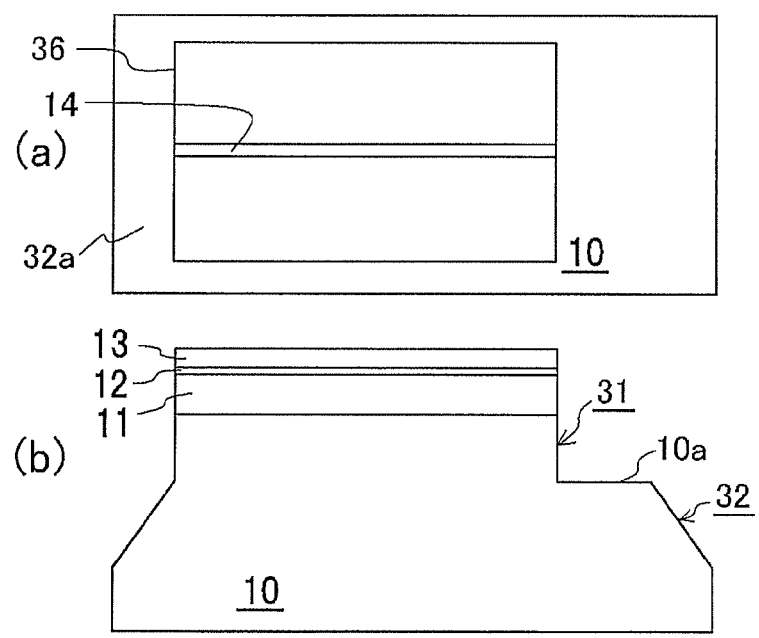
FIG. 9 is a schematic plane view and a schematic longitudinal section view describing a structure of still another laser element of the present invention.
Figure 10:
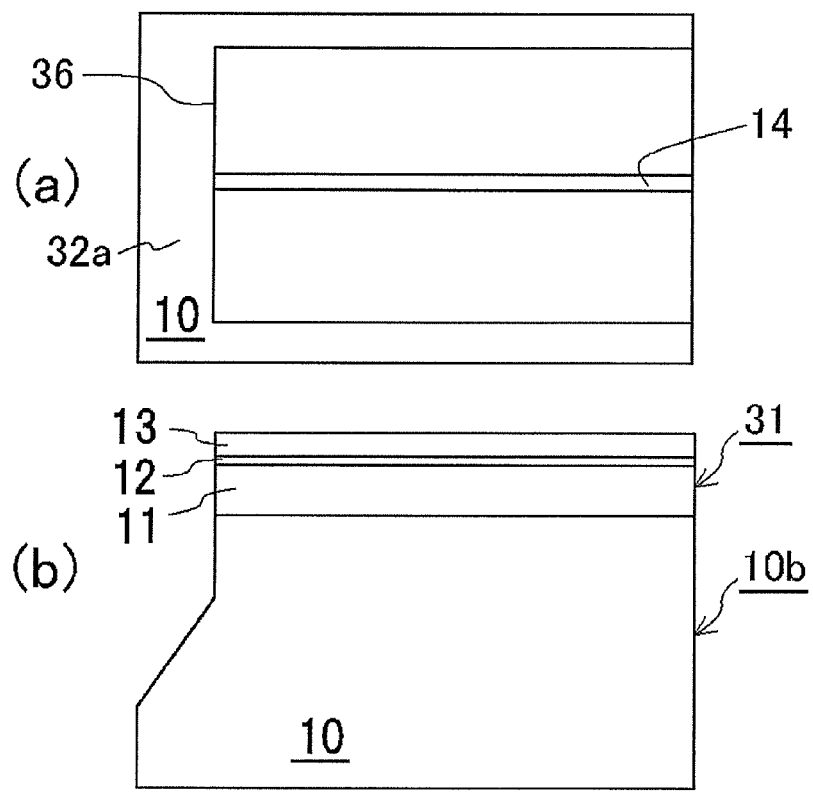
FIG. 10 is a schematic plane view and a schematic longitudinal section view describing a structure of still another laser element of the present invention.

In the etching of the cavity plane, as discussed above, the position of the cavity plane and its distance from the groove are adjusted, and the etching conditions and so forth are also adjusted, thereby increasing the width of the groove and forming a second groove simultaneously with the formation of the cavity plane. That is, when the nitride semiconductor layer exposed through the mask pattern for forming the cavity plane is etched away between the groove and the end of this mask pattern, the slanted face of the groove exposed through the mask pattern is similarly etched away. Consequently, the slanted face (the upper face of the protruding part) is formed on the substrate side below the cavity plane. As shown in FIGS. 8 to 10, an element region 36 and a protruding part 32a that protrudes from the element region 36 are formed.

The result of this is that the angle of inclination of the groove is lessened, and the distance between the end of the mask pattern and the end of the groove is reduced by etching, and these can even be matched up and the two connected. The word "connected" here means that no horizontal face, that is, no face that is parallel to the substrate and/or the nitride semiconductor layer surface, is present between the cavity plane and the slanted face of the groove.

The linking of the two components is accomplished by forming an obtuse angle. Consequently, when the plane protective film (discussed below) is formed, as opposed to forming a plane protective film on the terrace-like horizontal face 10a shown in FIG. 5b, for example, stress can be reduced in the plane protective film, and adhesion can be improved. As a result, separation of the plane protective film can be prevented and the COD level can be raised.

With the present invention, at least with the cavity plane on the emission side, the inner wall of the first groove and part of the nitride semiconductor layer adjacent to the inner wall of the first groove may be etched to form the upper face of the protruding part. In other words, the cavity plane and the slanted face may be connected. Therefore, the cavity plane on the opposite side with respect to the emission face may similarly be such that a cavity plane 31 and a slanted face 32 are connected (see FIG. 8b), or may be such that a terrace-like horizontal face 10a is formed between the cavity plane 31 and the slanted face 32 (see FIG. 9b).

The cavity plane on the opposite side may be formed by cleavage, and may lie in the same plane as the cavity plane 31 and a substrate face 10b (see FIG. 10b). In this case, as shown in FIG. 10a, there is no protruding part on the opposite side. It is particularly preferable for the terrace-like horizontal face to be formed on the opposite side, for the reasons discussed below.

When the cavity plane and the slanted face of the groove are thus connected, there is no so-called terrace-like horizontal face in the laser element after splitting (discussed below), so reflection, scattering, and so forth of the laser beam that would otherwise be caused by this are prevented, and disturbance of the FFP (such as the appearance of a Y ripple) can be reduced.

In general, when a cavity plane is formed after the formation of a substrate splitting auxiliary groove, extremely high precision is required for the position of the emission-side plane to be accurately matched with the end of the auxiliary groove by photolithography for the purpose of connecting the auxiliary groove and the cavity plane on the light emission side, which means that this is difficult. Furthermore, performing this over the entire wafer is essentially impossible.

As discussed above, however, with the manufacturing method of the present invention, an auxiliary groove for substrate splitting is formed in advance, and in the formation of the cavity plane, the width of the auxiliary groove is expanded simultaneously with the plane formation by an etching process, so the plane and the end of the auxiliary groove coincide and can be connected. In addition, in the photolithography step for the cavity plane, a considerable margin of about a few microns can be allowed between the cavity plane and the end of the auxiliary groove, so very high precision is not required, and the auxiliary groove and the cavity plane can be easily connected.

There are no particular restrictions on the expansion of the groove width here, as long as it is enough to form a face that connects with the cavity plane, and the expansion of the groove width can be suitably adjusted by means of the distance between the end of the mask pattern used to form the cavity plane and the groove. More specifically, an example of the groove depth (H in FIG. 3b) is about 3.5 to 5 Mm from the nitride semiconductor layer surface. An example of the groove width (W in FIG. 3b) is about 3 to 8 µm, and preferably about 3 to 5 µm.

An example of the angle of the V here is about 75° or less, and preferably 20 to 75°, and more preferably 40 to 60° from the horizontal face of the substrate. The length from the cavity plane to the substrate splitting face (the end of the protruding part) is preferably about 0 to 50 µm. That is, the length of the laser element including the protruding part may be from about the same as the cavity length of the laser element to about 50 µm longer, and preferably is about 2 to 30 µm longer than the cavity length of the laser element.

Figure 11:
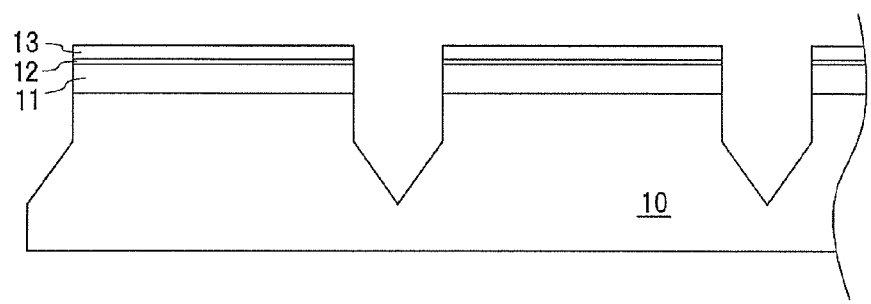
FIG. 11 is a schematic longitudinal section view showing a wafer unit for forming the laser element of FIG. 8.
Figure 12:
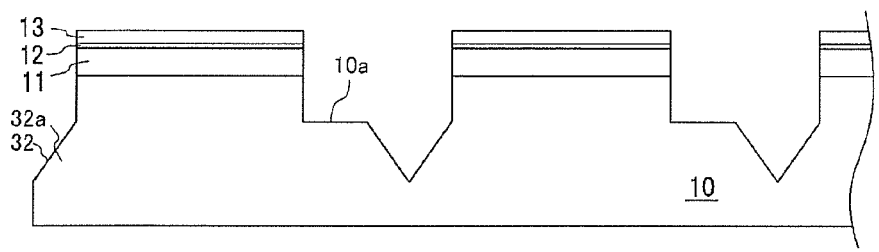
FIG. 12 is a schematic longitudinal section view showing a wafer unit for forming the laser element of FIG. 9.

When laser elements are formed in wafer units, and particularly when the elements are disposed such that the cavity planes of adjacent elements are opposite each other (FIGS. 11 and 12), the elements are disposed so as to be adjacent to each other with a protruding part (V groove) in between. Here, as shown in FIG. 11, if the two opposing cavity planes are connected to the side faces of the V groove, many chips can be disposed on the wafer. Also, as shown in FIG. 12, providing the terrace-like horizontal face on one side expands the spacing between adjacent cavity planes, so when a plane protective film is formed in a wafer state, it is easier to form the plane protective film. Also, since the volume of the substrate can be increased, heat dissipation is better, and thermal resistance can be lower than when a terrace-like horizontal face is not provided.

Figure 15:
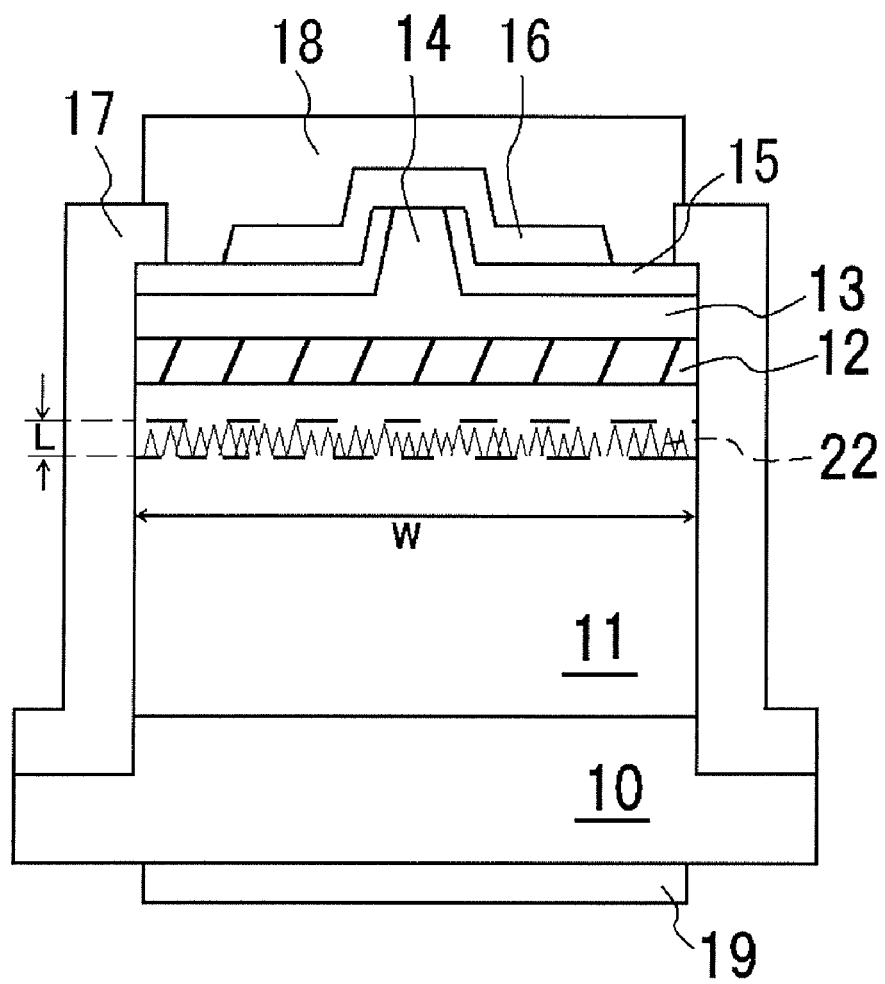
FIG. 15 is a schematic cross-sectional view describing a structure of another laser element of the present invention.

As shown in FIG. 15, the cavity plane of the present invention may have a region of greater surface roughness with respect to the active layer 12 (boundary region 22), more to the substrate 10 side than the active layer 12. The boundary region 22 refers to a region of greater surface roughness with respect to the active layer 12, in which the surface state of the cavity plane is observed and evaluated using a method known in this field, and differences in surface state or visual differences due to bumpiness are noted.

The surface state of the boundary region is usually formed in the cavity plane as an undulating shape, a scooped out shape, or a shape having a concave part. The boundary region is such that the width W at the cavity plane substantially coincides with the cavity plane, and there is a concave part whose depth from the cavity plane is at least 10 nm, and about 100 nm or less, and preferably at least 30 nm, and about 50 nm or less. The length L of the boundary region itself is about 400 to 1000 nm, and more preferably 500 to 700 nm. This concave part is preferably formed substantially parallel to the active layer.

Also, with the boundary region, the position of the concave part usually fluctuates in the height direction of the cavity plane, and traces a path, for example, that are serrated or comb-shaped when the cavity plane is viewed from the front (see FIG. 15). When there is thus a concave part that fluctuates in the height direction, the surface area of the boundary region can be increased, and adhesion to the protective film that covers the cavity plane can be improved. Also, if the boundary region is observed in a cross section parallel to the lamination face of the semiconductor, a shape is seen that has bumps that are continuous in the width direction of the laser element.

When there are thus bumps that are continuous in the width direction, adhesion can be improved in the entire width direction of the cavity plane. Furthermore, when the boundary region like this is present, the cavity plane is extremely flattened at the light emitting part, which prevents light scattering and maximizes light emission efficiency, while improving adhesion to the protective film that covers the cavity plane in the boundary region below, preventing separation of the protective film, and raising the COD level.

The surface state of the boundary region at the cavity plane, and of the region more toward the active layer side can be varied according to the shape of the mask used in etching the cavity plane. The degree of the surface state and the position of the boundary region can be suitably controlled according to the conditions for etching the nitride semiconductor layer (the type and flow of etchant, the RF power, the pressure, the temperature, the etching duration, etc.).

With the present invention, simultaneously with the formation of the cavity plane, side faces that define the shape of the laser element are also formed (usually, faces that are substantially perpendicular to the cavity plane), so the boundary region discussed above may also be formed on the side faces of the nitride semiconductor layer.

Figure 16:
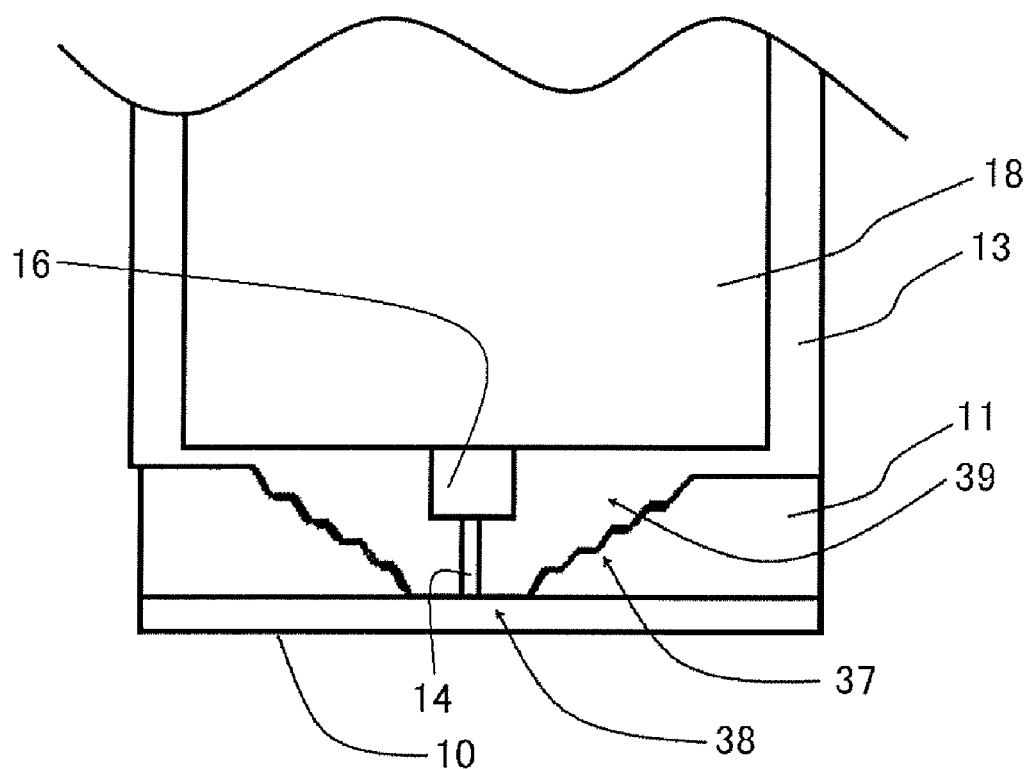
FIG. 16 is a schematic plane view describing a structure of another laser element of the present invention.

Also, as shown in FIG. 16, a convex part 39 may be provided to the end face on the cavity side of the semiconductor layer. This convex part 39 has a light emission face 38 and a side face 37. When the convex part 39 is seen in plan view, the shape of the side face 37 is a continuously undulating shape or a continuously bumpy shape. The side face 37 and light emission face 38 of this convex part 39 may have a region of greater surface roughness than the active layer (that is, the above-mentioned boundary region). Here, the boundary region provided to the side face 37 preferably has greater surface roughness and wider longitudinal direction than the boundary region provided to the light emission face 38.

The phrase "continuously undulating shape" here means that the shape of the side face as seen in plan view extends such that it snakes to the left and right, rather than being straight. This may also be a shape in which U-shaped patterns are linked, or in which inverted dome-shaped patterns are linked. The "continuously bumpy shape" is one in which the shape of the side face 37 when the convex part 39 is seen in plan view has corners and extends in stepped fashion. This bumpy shape is such that it snakes to the left and right, rather than being straight, and one of these patterns has corners.

The side face 37 of the convex part 39 has protrusions. These protrusions are formed parallel to the direction in which the undulating or bumpy shape extends on the side face 37 of the convex part 39, and are contiguous, with irregular width and height, much like a mountain range.

The planar shape of the convex part 39 is preferably such that the width in the light emission direction is narrow. With the present invention, because the convex part 39 has an undulating or bumpy shape in plan view, and the side face of the convex part 39 has a region of greater surface roughness than the light emission face, stray light released from the side face in the direction of the light emission face can be blocked. Furthermore, the planar shape of the convex part 39 has an undulating or bumpy shape, and narrows in the direction of the light emission face, so even if some stray light should be released from the side face of the convex part 39 to the outside, this stray light will be released in a direction other than the light emission face direction.

Forming the cavity plane convex part 39 in this way allows any light that leaks from the waveguide path region of the semiconductor layer to be scattered. Therefore, there is less light leakage released in the direction of the main beam of the laser, and an FFP with reduced ripple can be obtained. Also, mode hop in the longitudinal direction can be suppressed. Reducing ripple in the FFP of the laser beam facilitates design of a lens, and coupling with a lens, optical fibers or other such optical members.

The convex part 39 is preferably formed by etching.

With the method for manufacturing a nitride semiconductor laser element of the present invention, as discussed above, it is preferable if a plane protective film, that is a protective film formed in contact with the cavity plane, is formed over the entire cavity plane, or the groove and the cavity plane, after the cavity plane is formed.

The plane protective film may be a film composed of oxides of Si, Mg, Al, Hf, Nb, Zr, Sc, Ta, Ga, Zn, Y, B, Ti, etc., (especially $Al_2O_3$, $SiO_2$, $Nb_2O_5$, $TiO_2$, $ZrO_2$, etc.), nitrides (especially AlN, AlGaN, BN, SiN, etc.), fluorides, a combination of these two or more and the like. Among these, the plane protective film preferably composes of the oxides. In another view, it is preferably formed by a material which does not absorb the light of emission wavelength of the laser element.

The thickness of the plane protective film may be formed, for example, about 3 to about 1000 nm, and preferable 5 to 700 nm, and more preferable 10 to 400 nm.

The plane protective film covers the cavity plane formed on the nitride semiconductor layer, but does not necessarily cover the entire cavity plane, as long as it covers a optical waveguide path region of the cavity plane (encompassing the active layer and the layers above and below it).

Also, the protective film may partially cover a face other than the cavity plane. For instance, this plane protective film may be constituted as a side face protective film covering the side faces of the laser element at the same time as the cavity plane. This simplifies the manufacturing process and affords higher manufacturing efficiency. If the cavity plane and the side face protective film are formed at the same time, it is possible to increase adhesion to the protective film connected to the side face and the cavity plane.

The plan protective film can be formed, for example, by a method that is known in this field. For instance, this can be vapor deposition, sputtering, reactive sputtering, ECR plasma sputtering, magnetron sputtering, ion beam assist deposition, ion plating, laser ablation, CVD, spraying, spin coating, dipping, a combination of these two or more methods, a combination of these methods and one of a pretreatment partly or entirely, an irradiation of inert gas (Ar, He, Xe etc.) or plasma, an irradiation of oxygen, ozone gas or plasma, an oxidation treatment (thermal treatment), an exposure treatment or any of various other methods. In the combination method, forming and treating the film may not necessarily be performed simultaneously or continuously, it may be formed the film and then treated it, and vice versa.

In particular, the pretreatment is preferably performed with oxygen or ozone when the oxide film is formed as the plane protective film, the pretreatment is preferably performed with nitrogen when the nitride film is formed.

In the nitride semiconductor laser of the present invention, a second protective film, which has different film quality, material or composition, is preferably formed on the plane protective film. The second protective film may be a film composed of oxides of Si, Mg, Al, Hf, Nb, Zr, Sc, Ta, Ga, Zn, Y, B, Ti, etc., preferably be a film composed of $Al_2O_3$ or $SiO_2$. More preferably, it is formed of the same material as the plane protective film. This results in coincident with the coefficient of thermal expansion of the plane protective film and the second protective film, thereby reducing the occurrence of cracks in the plane protective film and the second protective film.

The second protective film may have any of single layer or laminated structure. For example, it includes a single layer of the Si oxide, a single layer of the Al oxide, a laminated layer of Si oxide and Al oxide and the like. The formation of such film can make the plane protective film to be more forcibly adhered into the cavity end face. As a result, stable performance can be ensured and the COD level can be raised.

The second protective film is preferably formed as an amorphous film. Forming this film prevents changes in the composition of the protective film, and allows the protective film to adhere more securely to the cavity plane.

There are no particular restrictions on the thickness of the second protective film, as long as it is thick enough to function as a protective film. This film thickness is preferably about 10 to 1500 nm. The combined thickness of the plane protective film and the second protective film is preferably about 2 μm or less.

The second protective film is similar to the above-mentioned protective film in that it can be formed by any of the known methods listed above, etc. In particular, the second protective film is preferably an amorphous film, to create an amorphous film, although it will depend on the film formation method, it is preferably to control film formation by adjusting the film formation rate to be faster, or controlling the atmosphere during film formation to be an oxygen atmosphere, or adjusting the film formation pressure higher, or the like, or by combining two or more of these methods. When an oxygen atmosphere is used, the oxygen is preferably introduced to the extent that absorption is not induced.

The plane protective film and the second protective film may formed not only on the emission side, but also on the reflecting side, and may be made of different materials, have different thicknesses, etc. Examples of the second protective film on the reflecting side include a laminated structure of Si oxide and Zr oxide, a laminated structure of Al oxide and Zr oxide, a laminated structure of Si oxide and Ti oxide, a laminated structure of Al oxide, Si oxide and Zr oxide, a laminated structure of Si oxide and Ta oxide and Al oxide, etc. The lamination period and so forth can be adjusted as needed, according to the desired reflectivity.

With the present invention, since the cavity plane is formed by etching, it is possible to form the protective film in contact with the cavity plane in wafer units, but the plane protective films may be formed in one step on opposing cavity planes, or the plane protective films may be formed in two steps on the light emission side and the light reflection side, and a more favorable plane protective film can be formed according to the function of each. Whichever method is used, manufacturing efficiency will be much higher than with a method in which individual plane protective films are formed on a bar-shaped wafer.

Also, with the method for manufacturing a nitride semiconductor laser element of the present invention, it is usually preferable for a third protective film to be formed over the nitride semiconductor layer surface and the side face of the ridge. That is, the third protective film is formed on the nitride semiconductor layer and in a region other than the region involving electrical contact, where the nitride semiconductor layer comes into direct contact with an electrode (discussed below). There are no particular restrictions on the position, size, shape, etc., of the region of connection between the nitride semiconductor layer and the electrode, but an example is part of the surface of the nitride semiconductor layer, such as substantially the entire stripe-shaped ridge upper face formed on the surface of the nitride semiconductor layer.

The third protective film is generally formed from an insulating material with a smaller refractive index than the nitride semiconductor layer. The refractive index can be measured with a spectral ellipsometer utilizing ellipsometry, and more specifically, by using an HS-190 made by the J.A. Woollam company, for example. The third protective film may be a film composed of single layer of laminated structure of an insulator or dielectrics such as oxides, nitride or oxynitride, etc. of Zr, Si, V, Nb, Hf, Ta, Al, Ce, In, Sb, Zn, etc. Thus forming the protective film from the side face of the ridge to the nitride semiconductor surface on both sides of the ridge ensures a refractive index difference with respect to the nitride semiconductor layer, and particularly the p-side semiconductor layer, allowing leakage of light from the active layer to be controlled, allowing light to be efficiently trapped within the ridge, ensuring good insulation near the bottom part of the ridge, and avoiding the generation of leak current.

The third protective film can be formed, for example, by a method that is known in this field. For instance, this can be vapor deposition, sputtering, reactive sputtering, ECR plasma sputtering, magnetron sputtering, ion beam assist deposition, ion plating, laser ablation, CVD, spraying, spin coating, dipping, a combination of these two or more methods, a combination of these methods and acid treatment (thermal treatment), or any of various other methods.

Generally, a p electrode is formed on the nitride semiconductor layer, that is, p-side semiconductor layer, and an n electrode is formed on n-side semiconductor layer or a conductive substrate.

The p electrode is preferably formed on the nitride semiconductor layer and the third protective film. When the p electrode is continuously formed on an uppermost nitride semiconductor layer and the third protective film, separation of the third protective film formed can be prevented. Particularly, the p electrode is formed on the side faces of the ridge, separation of the third protective film formed on the sides of the ridge can be efficiently prevented.

The p and n electrodes can be formed with a single layer or laminated layer of a metal or metal alloy of palladium, platinum, nickel, gold, titanium, tungsten, copper, silver, zinc, tin, indium, aluminum, iridium, rhodium, vanadium, ITO or the like.

The p electrodes are suitable formed in a thickness, according to the material used, of about 50 to about 500 nm, for example.

The p electrode and n electrode may be formed on at least the first and second nitride semiconductor layer or the substrate, respectively. Further, a single or a plurality of conductive layers such as a pad electrode may be formed on the electrodes.

The p pad electrode 18 is preferably formed on the upper face of the third protective film 15, p electrode 16 and the side face protective films 17, for example.

As discussed above, the plane protective film and the side face protective film may be formed in the same step. The plane protective film and the side face protective film may be continuous from the cavity plane to the second nitride semiconductor layer surface. The plane protective film and/or side face protective film formed on the nitride semiconductor layer surface, and the p electrode, the third protective film and the p-side pad electrode may be in contact or apart, and may be covered. Preferably, the plane protective film and/or side face protective film covers the third protective film and the p electrode. This prevents separation of the third protective film or the p electrode.

With a conventional method for manufacturing a laser element using a nitride semiconductor substrate, the cavity plane was formed by cleaving a wafer, so cleavage had to be performed the same number of times as the number of bar-shaped wafers. Also, when a protective film was formed on the cavity plane, a protective film had to be formed for every bar, with the protective film formation face of the bar-shaped wafer facing in the right direction (such as on the upper face), and these and other such requirements complicated the manufacturing process.

By contrast, with the method of the present invention for manufacturing a laser element, the cavity planes can be formed for a plurality of laser elements in wafer units all at the same time by a single step of etching, which improves manufacturing efficiency. Also, even after the cavity plane has been formed by etching, it is possible to form the protective film in a single step on the cavity planes of laser elements in wafer units, which further improves manufacturing efficiency.

Also, with the method of the present invention for manufacturing a laser element, after cavity planes have been formed on laser elements in wafer units, a previously formed groove (second groove) can be utilized as a splitting auxiliary groove to split up the substrate.

A specific example of a splitting method is to use a break blade to split along the splitting auxiliary groove from the back side of the substrate. Another method is to form a groove so as to obtain the desired chip shape by irradiation with a laser beam or the like just prior to splitting the substrate (in the cavity plane portion on the light emission side, laser irradiation is avoided because the split has to go along the V-shaped auxiliary groove), and use a roller breaker or the like to split the substrate along the groove and a V-shaped auxiliary groove. With this method, there is no need to split one at a time with the blade of a break apparatus, and an entire wafer can be split all at once just by rolling the roller under a load over the wafer, so efficiency is better. Any other method known in this field can also be used.

Furthermore, an assist groove is preferably formed perpendicular to the cavity plane, that is, parallel to the ridge or the current constricting layer, after the constituent elements (electrodes, protective films, etc.) of the various laser elements have been formed, either simultaneously with or before or after the formation of the groove that is formed continuously at the cavity plane. This formation method may be the same as the one described above, or a method known in this field, such as irradiation with a laser beam, can be used instead.

For example, the assist groove for element splitting can be formed as follows.

Figure 17A:
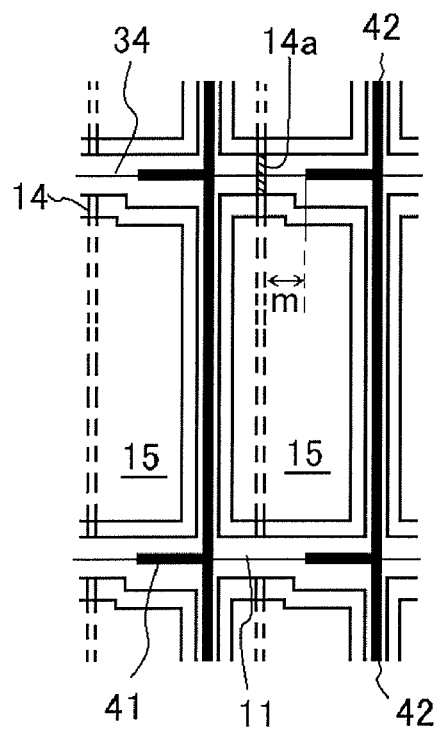
FIG. 17A is a schematic plane view describing a manufacturing method of an assist groove of a laser element of the present invention.
Figure 17B:
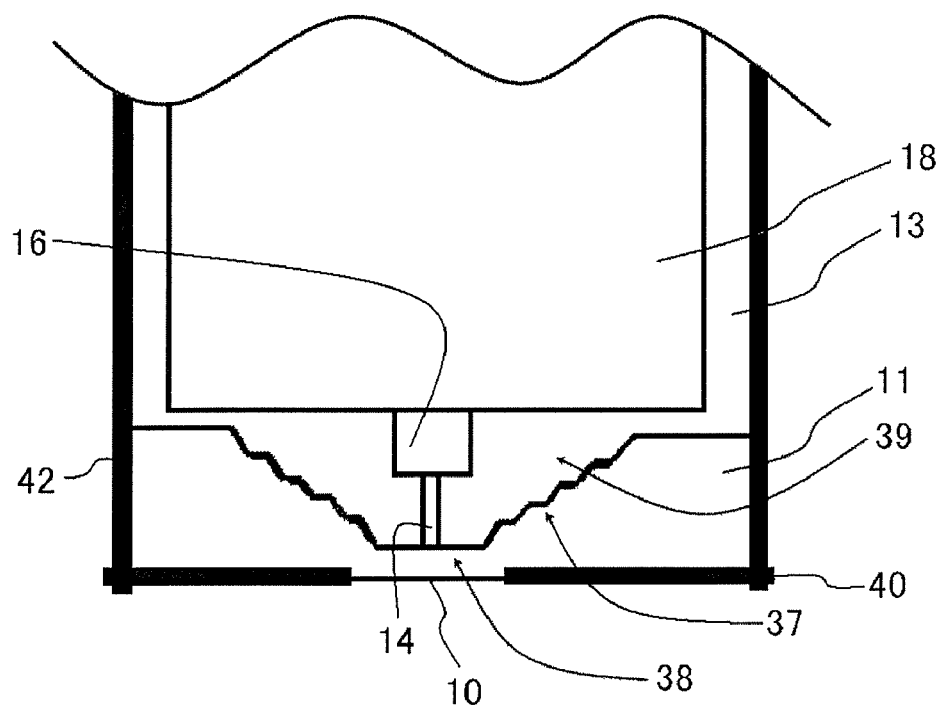
FIG. 17B is a schematic plane view describing another manufacturing method of an assist groove of a laser element of the present invention.

The assist groove is preferably formed from the nitride semiconductor layer side in the region where the substrate or the first nitride semiconductor layer has previously been exposed. The assist groove, as shown in FIGS. 17A and 17B, may be not only a second assist groove 42 formed perpendicular to the cavity plane (or parallel to the ridge 14), but also the first assist grooves 41 and 40 formed parallel to the cavity plane (or perpendicular to the ridge 14), in addition to the first and second grooves discussed above. These assist grooves may all be formed in advance.

In plan view, the first assist grooves are preferably formed so as to be away (such as about a distance m away) from an extension of the waveguide path region (14a in FIG. 17A). The first assist grooves may be provided over the second groove provided previously during the formation of the cavity plane.

The second assist groove is formed on both sides of the ridge when the nitride semiconductor layer is equipped with the stripe-shaped ridge 14 on its surface.

Preferably at least some of the first assist grooves and second assist groove intersect substantially perpendicularly, and preferably both intersect. Also, the first assist grooves and second assist groove are preferably formed so as to intersect at the corners of the laser elements. This makes it possible for the assist grooves to be used to reliably split the wafer. The grooves may also only intersect on one side in the cavity direction of the laser element.

It is suitable for the first assist grooves and second assist groove to be formed such that the second assist groove is deeper than the first assist grooves. The second assist groove may be formed so that the wafer is completely separated in a direction perpendicular to the cavity plane.

There are no particular restrictions on the method for forming the first assist grooves and second assist groove, and any method at all may be used. In forming the first assist grooves and second assist groove, they are preferably formed so as to have a V-shaped cross section. Also, the apex angle at the V-shaped bottom of the second assist groove is preferably smaller than that of the first assist grooves. This allows the second assist groove to be formed deeper than the first assist grooves even through the first assist grooves and second assist groove are about the same width at the surface.

Because the first assist grooves and second assist groove are formed at different depths, the splitting of the wafer along the cavity plane can be carried out precisely and reliably in the desired region, which markedly reduces the defect rate in the wafer splitting process.

Furthermore, even if the second assist groove is made quite deep with respect to element splitting in the cavity direction, where splitting problems are most likely to occur, the cavity plane will not have to undergo any treatment, working, or the like subsequently, so the unintended splitting or splitting defects that could occur in these steps can be avoided, which boosts the yield.

Examples of the laser element of the present invention will now be described in detail through reference to the drawings. The following reference number will be applied in the FIGS.

Example 1

The nitride semiconductor laser element in this Example, as shown in FIGS. 1, 2, and 8, is produced by laminating a first nitride semiconductor layer (n-side, for example) 11, an active layer 12, a second nitride semiconductor layer (p-side, for example) having a ridge 14 formed on its surface, in that order over a GaN substrate 10 whose growth plane is the C plane, and forming a cavity having a cavity plane 21.

A face ($\epsilon$ in FIG. 2) that is slanted by about 50° with respect to the GaN substrate 10 is formed on the GaN substrate 10 and below the cavity plane 21. Below this and under the GaN substrate 10, there is a protruding part 32a on which is formed a face substantially parallel to the cavity plane 21.

This semiconductor laser element further comprises a protective film (not shown) composed of $Al_2O_3$ and a second protective film (not shown) on the cavity plane, (thickness: 20 nm and 100 nm, respectively) as well as a third protective film 15, a p electrode 16, an n electrode 19, a side face protective film 17, a p pad electrode 18, a plane protective film 20, and so forth.

This laser element can be manufactured as follows.

First, a gallium nitride substrate is provided. A layer (2 μm thick) composed of $Al_{0.03}Ga_{0.97}N$ doped with Si at $4 \times 10^{18}/cm^3$ is grown on the gallium nitride substrate at a growth temperature of 1160° C. using trimethylaluminum (TMA), trimethylgallium (TMG), ammonia ($NH_3$) and silane gas. This n-side clad layer may be composed of a super lattice structure.

Next, the silane gas is stopped, and n-side wave guide layer composed of undoped GaN (0.175 μm thick) is grown at a growth temperature of 1000° C. This wave guide layer may be doped with n-type impurities.

The temperature is set to 900° C., a barrier layer composed of $In_{0.02}Ga_{0.98}N$ doped with Si (14 nm thick) and at same temperature, a well layer composed of undoped $In_{0.07}Ga_{0.93}N$ (7 nm thick) are grown. This growth of the barrier layer and well layer is repeated 2 times, finally the barrier layer is formed on the layers to grow an active layer composed of a multi quantum well structure (MQW)) with a total thickness of 56 nm.

The temperature is raised to 1000° C., a p-side cap layer composed of p-$Al_{0.25}Ga_{0.75}N$ doped with Mg at $1 \times 10^{20}/cm^3$ (10 nm thick) is grown using TMG, TMA, $NH_3$, and $Cp_2Mg$ (bis-cyclopentadienyl magnesium), which has a greater band gap energy than that of a p-side wave guide layer.

Next, $Cp_2Mg$ and TMA are stopped, and p-side wave guide layer composed of undoped GaN (0.145 μm thick) is grown at a growth temperature of 1000° C., which has a smaller band gap energy than that of the p-side cap layer.

The temperature is set to 1000° C., and a layer composed of undoped $Al_{0.10}Ga_{0.90}N$ (2.5 nm thick) is grown, and then TMA is stopped and $Cp_2Mg$ is used, a layer composed of Mg doped GaN (2.5 nm thick) is grown to grow a p-side clad layer composed of a super lattice structure with a total thickness of 0.45 Mm.

Finally, a p-side contact layer composed of GaN doped with Mg at $1 \times 10^{20}/cm^3$ (15 nm thick) is grown on the p-side clad layer at a growth temperature of 1000° C.

Figure 4:
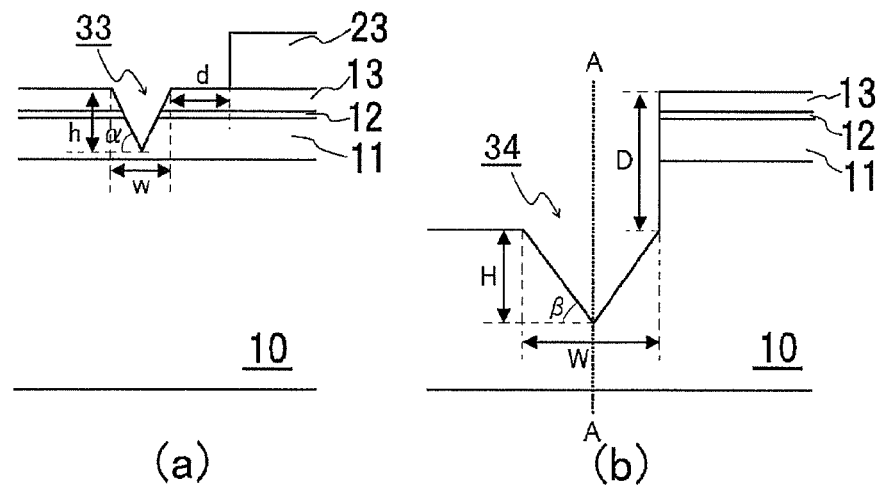
FIG. 4 is a schematic longitudinal section view describing a manufacturing method of a groove and a cavity plane of a laser element of the present invention.
Figure 13:
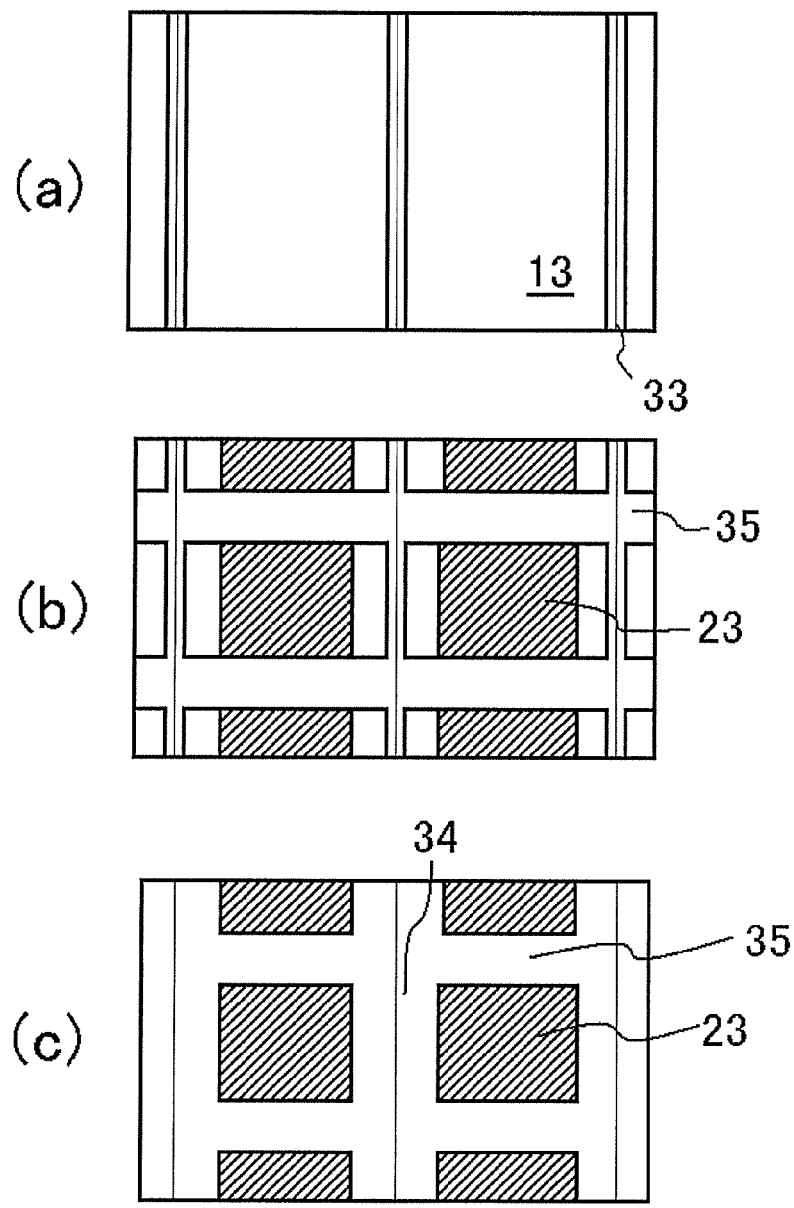
FIG. 13 is a schematic plane view describing a manufacturing method of a groove and a cavity plane of a laser element of the present invention.

The obtained wafer on which a nitride semiconductor has been grown is taken out from the reaction vessel, and as shown in FIGS. 4a and 13a, an auxiliary groove (first groove 33) for splitting the GaN substrate 10 is formed from above the second nitride semiconductor layer 13. This auxiliary groove extends in its length over the entire wafer, with the groove width w being about 2 μm, the groove depth h about 2.5 μm, and the groove spacing about 400 μm. That is, the length of the laser element is set to 400 μm.

The groove can be formed in a V shape by forming an $SiO_2$ film over substantially the entire second nitride semiconductor layer surface, then forming the desired mask pattern by photolithography and etching, and using this as a mask to etch the nitride semiconductor layer approximately 2.5 μm using RIE with $SiCl_4$ gas to which a small amount of $Cl_2$ gas has been added. This V-shaped auxiliary groove has an inclination angle (α in FIG. 4a) of the etched face of approximately 70° with respect to the horizontal face of the substrate.

Then, as shown in FIG. 13b, a cavity plane and a groove 35 (side face parallel to the cavity direction) for defining the structure of the laser element are formed so as to form a substantially square structure with a cavity width of 150 μm and a cavity length of about 396 μm. An $SiO_2$ film is formed over substantially the entire wafer surface, after which a mask pattern is formed from $SiO_2$ in the desired shape (23 in FIG. 4a, and 23 in FIG. 13b) by photolithography and etching under the above-mentioned conditions (at this point, the distance (d in FIG. 4a) between the end of the V auxiliary groove and the mask end that is the position that will become the cavity plane is approximately 2 μm), and this is used as a mask to form a cavity plane by RIE the nitride semiconductor layer with $Cl_2$ gas to which a small amount of $SiCl_4$ gas has been added. The V auxiliary groove is etched at the same time, deepening it to a depth (H in FIG. 4b) of about 4 μm, and widening it to a width (W in FIG. 4b) of about 4 μm, and shrinking the distance between the cavity plane and the end of the V auxiliary groove (first groove 33), which had been about 2 μm, and forming a second groove (34 in FIG. 4b, and 34 in FIG. 13c) so that the groove and the plane are in a connected form.

The etching depth (D in FIG. 4b) here is approximately 4 μm from the surface of the p-side contact layer in the portion other than the V auxiliary groove, but within the V auxiliary groove the etching rate is lower because deposits tend to accumulate in the groove, do the depth is only about 1.5 μm. Also, the inclination angle (β in FIG. 4b) of the etched face of the V auxiliary groove at this point is approximately 50° with respect to the horizontal face of the substrate.

Next, a stripe-shaped mask composed of $SiO_2$ is formed over substantially the entire surface of the p-side contact layer, and the nitride semiconductor layer(s) are etched by RIE using $SiCl_4$ gas and the stripe-shaped mask. By this means, a stripe-shaped waveguide region, ridge is formed.

Then, the sides of the ridge are protected by a third protective film (embedded film) composed of $ZrO_2$.

Next, a p electrode composed of Ni (10 nm)/Au (100 nm)/Pt (100 nm) is formed on the surface overlying the p-side contact layer and the third protective film. After formation of the p electrode, ohmic annealing is performed at 600° C.

Subsequently, a mask using a resist is formed on the part of the electrode of thus obtained element, and a plane protective film (light emission side) and a side face protective film are simultaneously formed under the condition described below on the other region thereof. That is, the obtained element is transferred into a sputtering apparatus, the protective film (10 nm) which is composed of $Al_2O_3$ is formed at a microwave power/RF power of 500 W, and an argon flow of 30 sccm, and an oxygen flow of 9.0 sccm using an Al target.

Next, on the protective film composed of $Al_2O_3$ and formed on the light emission face of the cavity plane, an $SiO_2$ film is formed as the second protective film in a thickness of 130 nm with a sputtering apparatus using an $SiO_2$ target, at a microwave power/RF power of 500 W, an argon flow of 45 sccm, and an oxygen flow of 4.5 sccm.

A mask is formed on a region other than the light reflecting side of the cavity plane, an $Al_2O_3$ film is formed in a thickness of 10 nm and a $ZrO_2$ film is formed in a thickness of 67 nm and, $SiO_2/ZrO_2$ films are formed in a thickness of 67 nm/45 nm with six cycle repetition thereon under the same condition as that of the emission side.

Ni (8 nm)/Pd (200 nm)/Au (800 nm) are formed continuously on the exposed p electrode, to produce a p pad electrode.

And then, the surface of the substrate which is opposite to the side growing the nitride semiconductor layers is polished so as to have a thickness of 80 μm.

An n electrode composed of Ti(15 nm)/Pt (200 nm)/Au (300 nm) is formed on the polished surface of the substrate.

After that, the splitting is performed using the groove as described above and a blade of a breaking apparatus from the side of the substrate on which the n electrode has been formed, along with an A-A line, to produce bars.

Next, the bar is chipped in the direction parallel to the p electrode to be formed into a chip for a semiconductor laser element.

The threshold current was measured, and the COD level was evaluated for the semiconductor laser element thus obtained.

For the sake of comparison, a laser element was formed by substantially the same manufacturing method as for the above-mentioned semiconductor laser element, except that the cavity plane was formed by cleavage, and then the threshold current was measured as an initial value and the COD level was evaluated, all under the same conditions.

As a result, the value was about 25 mA (median value for 70 measurements) with the semiconductor laser element in this Example, whereas with the semiconductor laser element having a cavity plane produced by cleavage, the value was about 28 mA, meaning that while there was a slight difference, it was confirmed that the semiconductor laser element of this Example exhibited the same or a lower threshold compared to the semiconductor laser element produced by cleavage.

As to the COD level, it was about 566 mW (median value for 20 measurements) with the semiconductor laser element of this Example, whereas it was about 571 mA with the semiconductor laser element having a cavity plane produced by cleavage, and it was confirmed that the COD level was about the same as that of the semiconductor laser element produced by cleavage.

The FFP-Y was also measured for the resulting semiconductor laser element.

Figure 5:
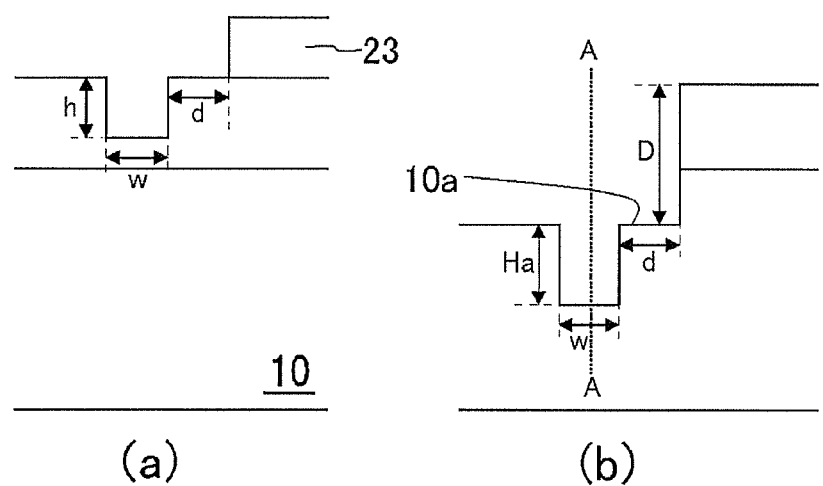
FIG. 5 is a schematic longitudinal section view describing a manufacturing method of a groove and a cavity plane of a laser element as a comparison.

For the sake of comparison, the first auxiliary groove was formed not in a V shape as in FIG. 4a, but in a vertical shape as shown in FIG. 5a (h, w, and d in FIG. 5a are the same as in FIG. 4a). In forming the cavity plane, rather than using a wide V-shaped groove as shown in FIG. 4b, the distance d between the end of the auxiliary groove and the position that would become the cavity plane was set to approximately 2 µm, as shown in FIG. 5b, forming an auxiliary groove with a vertical shape and a depth Ha (Ha: 3.5 µm; d and w in FIG. 5b are the same as in FIG. 4a; D in FIG. 5b is the same as in FIG. 4b). Otherwise, a laser element was formed by the substantially same manufacturing method as that of the above-mentioned semiconductor laser element, and the FFP-Y was measured under the same conditions.

Figure 6:
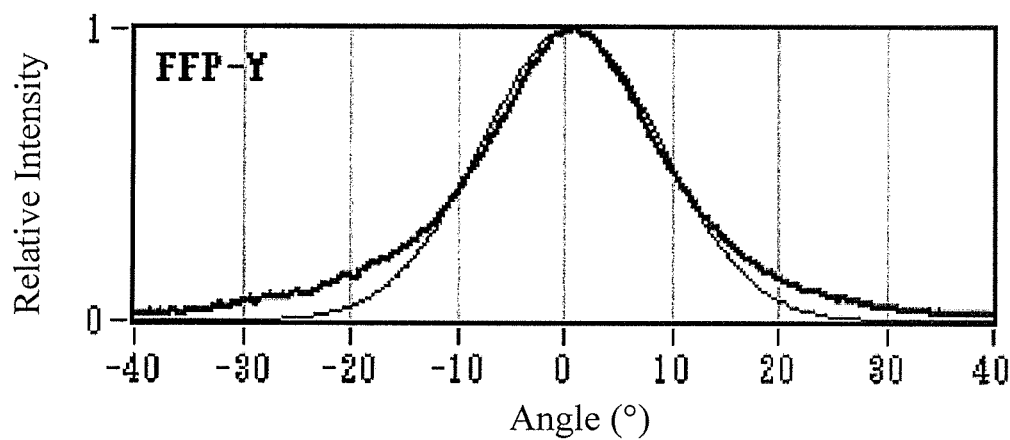
FIG. 6 is a graph showing FFP-Y of a laser element of the present invention.
Figure 7:
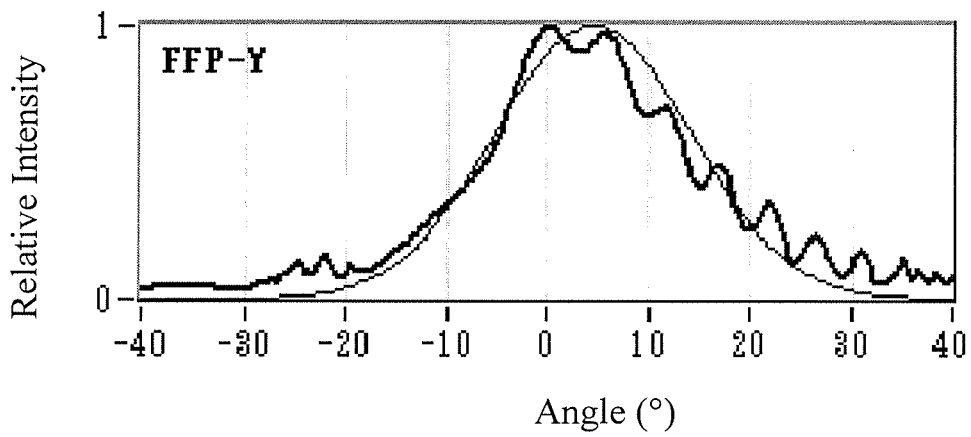
FIG. 7 is a graph showing FFP-Y of a laser element as a comparison.

The measurement results for this Example are shown in FIG. 6, and the measurement results for the comparative semiconductor laser element are shown in FIG. 7. The thinner lines in FIGS. 6 and 7 are Gaussian curves calculated from the measurement results for the measured samples.

In FIGS. 6 and 7, a pronounced Y ripple appeared on the ridge side (the + side in FIG. 7) due to the light from the emission plane being reflected by the horizontal face 10a of the substrate between the plane and the auxiliary groove when there was a distance between the auxiliary groove and the cavity plane.

Meanwhile, it was confirmed that since this horizontal face 10a is not formed with the semiconductor laser element of this Example, this Y ripple caused by reflection is eliminated almost completely.

Example 2

In this Example, as shown in FIGS. 9 and 12, a laser element is formed in which the slanted face 32 and the protruding part 32a are formed on the emission-side cavity plane, and the terrace-like horizontal face 10a and a protruding part are on the cavity plane on the opposite side from the emission side.

More specifically, the formation is the same as in Example 1, except that after the first groove is formed, a mask is formed as a mask pattern for defining the structure of the laser element, using a substantially square structure with a cavity length of 370 µm, and in which the distance between the end of the V auxiliary groove and the position that will become the cavity plane is approximately 2 µm on one side and approximately 24 µm on the other side.

Consequently, as shown in FIG. 12, one cavity plane had a shape in which the plane was continuous with the groove, while the other cavity plane had a terrace-like horizontal face 10a with a length of approximately 26 µm, and this gave the laser element shown in FIG. 9.

With this laser element, just as with the laser element in Example 1, the Y ripple caused by reflection of the emitted light on the terrace-like horizontal face can be almost completely eliminated. Furthermore, since there is a terrace-like horizontal face on the reflection side, the volume of the substrate can be increased compared to Example 1, allowing the thermal resistance to be lowered and affording excellent heat dissipation.

Example 3

Figure 14:
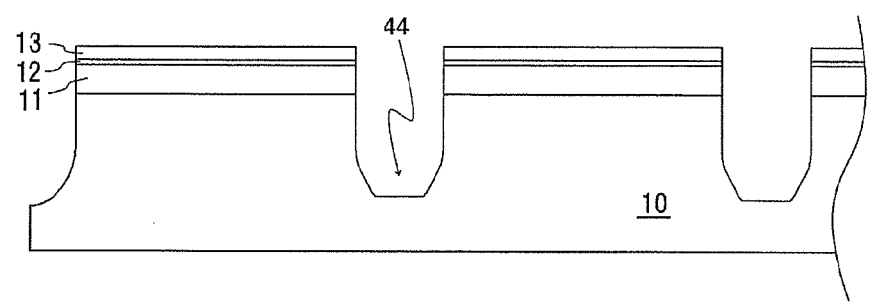
FIG. 14 is a schematic longitudinal section view showing a wafer unit for forming the laser element of the present invention.

In this Example, as shown in FIG. 14, the cross sectional shape of the second groove 44 is not V shaped, but closer to U shaped.

More specifically, in etching to form the auxiliary groove (first groove), the formation was carried out in the same manner as in Example 1, except that the flow of etchant gas was cut in half. This allowed the lower part of the groove to be more rounded, allowing a groove to be formed in a shape approximating a U shape.

With this laser element, just as with the laser element of Example 1, the Y ripple caused by emitted light being reflected at the terrace-like horizontal face can be almost completely eliminated.

Example 4

In this Example, as shown in FIG. 10, the reflection-side cavity plane and the substrate face are formed so as to be in the same plane (see FIG. 10b).

More specifically, the first grooves are formed at a spacing of about 800 µm, and in forming the cavity plane and the groove for defining the structure of the laser element (the side face parallel to the cavity direction), just the cavity plane on the emission side is formed by etching in a state in which the area near the cavity plane on the reflection side is covered with a mask, and the V auxiliary groove is etched at the same time to form a second groove.

After this, in the splitting of the nitride semiconductor substrate into bars, the reflection-side cavity plane is formed by cleaving the substrate so that the second grooves are equidistantly spaced. Otherwise, the formation is the same as in Example 1. Consequently, two laser elements are obtained with a length of approximately 400 µm, and these elements have the cavity plane 31 and the substrate face 10b (see FIG. 10b) in the same plane, and there is no protruding part on the reflection side, as shown in FIG. 10a.

With this laser element, just as with the laser element in Example 1, the Y ripple caused by emitted light being reflected at the terrace-like horizontal face can be almost completely eliminated.

Example 5

In this Example, everything is substantially the same as in Example 1, except that, as shown in FIG. 15, a region (boundary region 22) of greater surface roughness with respect to the active layer 12 is formed on part of the cavity plane, and in splitting into elements, as shown in FIG. 17A, a first assist groove 41 and a second assist groove 42 are formed and used for splitting.

Consequently, the same effect is obtained as in Example 1.

Also, in the boundary region 22, adhesion to the protective film covering the cavity plane can be improved, separation of the protective film is prevented, and the COD level can be raised.

Furthermore, unintended splitting or splitting defects can be avoided, which boosts the yield.

Thus, with the method for manufacturing a nitride semiconductor laser element of the present invention, the terrace-like horizontal face is eliminated between the cavity plane and the element separation face, and the disturbance of the far field pattern that would be caused by this horizontal face, namely, ripple, and more particularly ripple in the Y direction, is prevented, allowing a good far field pattern to be formed. Furthermore, no new manufacturing process or manufacturing equipment is required, so these benefits can be obtained with a simple method.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A method for manufacturing a nitride semiconductor laser element having a nitride semiconductor layer including at least an active layer provided on a substrate, a pair of cavity planes formed on the nitride semiconductor layer so that light resonates between the cavity planes in the nitride semiconductor layer, and a protruding part where part of the substrate protrudes from said cavity plane, said method comprising:
   a step of forming a wafer unit by forming the nitride semiconductor layer on the substrate;
   a first etching step of forming a first groove by etching at least the nitride semiconductor layer of the wafer unit so that the first groove extends parallel to a direction along which the cavity planes of the nitride semiconductor laser element will be formed; and
   a second etching step of forming at least one of the cavity planes,
   in the second etching step, an inner wall of the first groove and a part of a surface of the nitride semiconductor layer adjacent to the first groove are etched to form a second groove along the first groove so that an inner wall of the second groove defines the at least one of the cavity planes and an upper face of the protruding part that is slanted with respect to the at least one of the cavity planes and with respect to a horizontal face of the substrate.

2. The method of claim 1, wherein
the first groove is narrower at its bottom part than at its top part.

3. The method of claim 1, wherein
a width of the second groove is formed larger than a width of the first groove.

4. The method of claim 1, wherein
an angle of the upper face of the protruding part is 75° or less from the horizontal face of the substrate.

5. The method of claim 1, further comprising
forming a plane protective film over an entirety of the at least one of the cavity planes and the second groove after the at least one of the cavity planes is formed.

6. The method for claim 1, further comprising
splitting the substrate utilizing the second groove as a splitting auxiliary groove.

7. The method for claim 1, wherein
in the second etching step, the second groove is formed so that the upper face of the protruding part is connected to the at least one of the cavity planes.

8. The method for claim 1, wherein
the step of forming the nitride semiconductor layer on the substrate includes forming the nitride semiconductor layer on one of a sapphire substrate, a spinel substrate, a silicon substrate, a ZnS substrate, a ZnO substrate, a GaAs substrate, a diamond substrate, a lithium niobate substrate, a neodymium gallide substrate, and a nitride semiconductor substrate.

9. The method for claim 1, wherein
the step of forming the nitride semiconductor layer on the substrate includes forming the nitride semiconductor layer on one of a GaN substrate and a AlN substrate.

10. The method for claim 1, wherein
the first etching step includes forming the first groove so that a cross sectional shape of the first groove is one of semicircular, semi-elliptical, square, V-shaped, and trapezoidal.

11. The method for claim 1, wherein
the first etching step includes forming the first groove so that a cross sectional shape of the first groove has a V-shape with an angle of the V-shape being about 40° to 85°.

12. The method for claim 1, wherein
the second etching step includes forming the at least one of the cavity planes so that the at least one of the cavity planes is connected to the upper face of the protruding part that is slanted with respect to the at least one of the cavity planes.

13. The method for claim 1, wherein
the second etching step further includes forming one of the cavity planes disposed on a non-light emission side such that a terrace-shaped horizontal face is formed between the one of the cavity planes disposed on the non-light emission side and the upper face of the protruding part that is slanted with respect to the at least one of the cavity planes.

14. The method for claim 1, wherein
the second etching step includes forming the second groove so that a cross sectional shape of the first groove is one of V-shaped and U-shaped.

* * * * *